(12) United States Patent
Deshpande

(10) Patent No.: US 8,310,234 B2
(45) Date of Patent: Nov. 13, 2012

(54) SYSTEM FOR FAT SUPPRESSION IN MR IMAGE ACQUISITION

(75) Inventor: Vibhas Deshpande, Sunnyvale, CA (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 286 days.

(21) Appl. No.: 12/861,943

(22) Filed: Aug. 24, 2010

(65) Prior Publication Data

US 2011/0227572 A1  Sep. 22, 2011

Related U.S. Application Data

(60) Provisional application No. 61/314,653, filed on Mar. 17, 2010.

(51) Int. Cl.
*G01V 3/00* (2006.01)

(52) U.S. Cl. ........................ 324/309; 324/300; 324/310

(58) Field of Classification Search .................. None
See application file for complete search history.

(56) References Cited

U.S. PATENT DOCUMENTS

| | | | |
|---|---|---|---|
| 5,304,931 A * | 4/1994 | Flamig et al. ................ | 324/309 |
| 5,327,088 A | 7/1994 | Pipe | |
| 5,757,188 A | 5/1998 | Miyazaki | |
| 5,995,863 A | 11/1999 | Farace et al. | |
| 6,342,786 B1 | 1/2002 | Heid | |
| 7,046,003 B2 * | 5/2006 | Hargreaves et al. .......... | 324/307 |
| 7,574,248 B2 | 8/2009 | Ackerman et al. | |
| 7,649,354 B2 | 1/2010 | Bayram et al. | |
| 2010/0097062 A1 | 4/2010 | Shirai et al. | |

FOREIGN PATENT DOCUMENTS

CN  101401723 A  4/2009

OTHER PUBLICATIONS

Nagy, Zoltan et al. "Efficient Fat Suppression by Slice-Selection Gradient Reversal in Twice-Refocused Diffusion Encoding", Magnetic Resonance in Medicine 60:1256-1260 (2008).

Liu Xinqiu, et al., "Study of Lower Limbs MRI Technology", Chinese Medical Equipment Journal, No. 2, vol. 28, 2007.

* cited by examiner

*Primary Examiner* — Jermele M Hollington
*Assistant Examiner* — Trung Nguyen
(74) *Attorney, Agent, or Firm* — Alexander J Burke

(57) ABSTRACT

A system for fat signal suppression in MR imaging comprises an RF signal generator for generating RF pulses in an MR pulse sequence using one or more RF pulses for echo signal formation including, an RF excitation pulse and an RF refocusing pulse subsequent to said RF excitation pulse. A magnetic field slice select gradient generator generates first and second different slice select magnetic field gradients for corresponding use with the RF excitation pulse and the RF refocusing pulse, respectively, the first and second different slice select magnetic field gradients having substantially different amplitudes. An MR imaging control unit directs acquisition of MR imaging data having fat signal substantially suppressed using the generated RF pulses and different slice select magnetic field gradients.

20 Claims, 6 Drawing Sheets

SYSTEM FOR FAT SUPPRESSION IN MR IMAGE ACQUISITION

This is a non-provisional application of provisional application Ser. No. 61/314,653 filed 17 Mar., 2010, by V. Deshpande.

FIELD OF THE INVENTION

This invention concerns a system for fat signal suppression in MR imaging.

BACKGROUND OF THE INVENTION

Diffusion imaging in body and breast MR applications is performed using a spin echo EPI (Echo Planar Imaging) pulse sequence. Either dual refocused or a standard Stejskal Tanner diffusion scheme (single refocusing) may be used to acquire the data. It is often desired to suppress the fat signal in such acquisitions as an unsuppressed fat signal causes spatial shifts and ghosting in resulting images. Known methods for fat suppression involve use of either a spectrally selective fat suppression pulse, a spectrally selective partial inversion recovery (SPIR), or a spectral adiabatic inversion pulse (SPAIR) before the EPI (Echo Planar Imaging) excitation pulse. Water excitation is another option to suppress the fat signal. Known methods rely on a relatively homogenous field $B0$ to achieve good fat suppression. If there are changes in $B0$, then the above methods fail to achieve good fat suppression. A system according to invention principles addresses improving fat suppression in MR image acquisition and related problems.

SUMMARY OF THE INVENTION

A system improves fat suppression in MR image acquisition using an MR pulse sequence that uses one or more RF pulses to form an echo (e.g., spin echo or stimulated echo) and different slice selection gradient amplitudes for RF pulses (lower bandwidth RF pulses) for EPI in conjunction with slice select gradient reversal to improve fat suppression in spin-echo EPI diffusion imaging. A system for fat signal suppression in MR imaging comprises an RF signal generator for generating RF pulses in a spin echo signal formation including, an RF excitation pulse and an RF refocusing pulse subsequent to said RF excitation pulse. A magnetic field slice select gradient generator generates first and second different slice select magnetic field gradients for corresponding use with the RF excitation pulse and the RF refocusing pulse, respectively, the first and second different slice select magnetic field gradients having substantially different amplitudes and/or polarities. An MR imaging control unit directs acquisition of MR imaging data having fat signal substantially suppressed using the generated RF pulses and different slice select magnetic field gradients.

DETAILED DESCRIPTION OF THE INVENTION

A system improves fat suppression in MR image acquisition using an MR pulse sequence that uses one or more RF pulse/pulses to form an echo and a low bandwidth excitation RF pulse. The system advantageously uses different slice selection gradient amplitudes for RF pulses (also called low bandwidth excitation) for EPI in conjunction with slice select gradient reversal to improve fat suppression in spin-echo EPI diffusion imaging. An RF refocusing pulse is applied when proton spins return to the same starting phase they had after an initial excitation RF pulse. Spin echo sequences use 180° pulses, for example, to refocus the proton spins to generate signal echoes and gradient echo sequences use a refocusing gradient to maximize remaining transverse magnetization.

Figure 1:
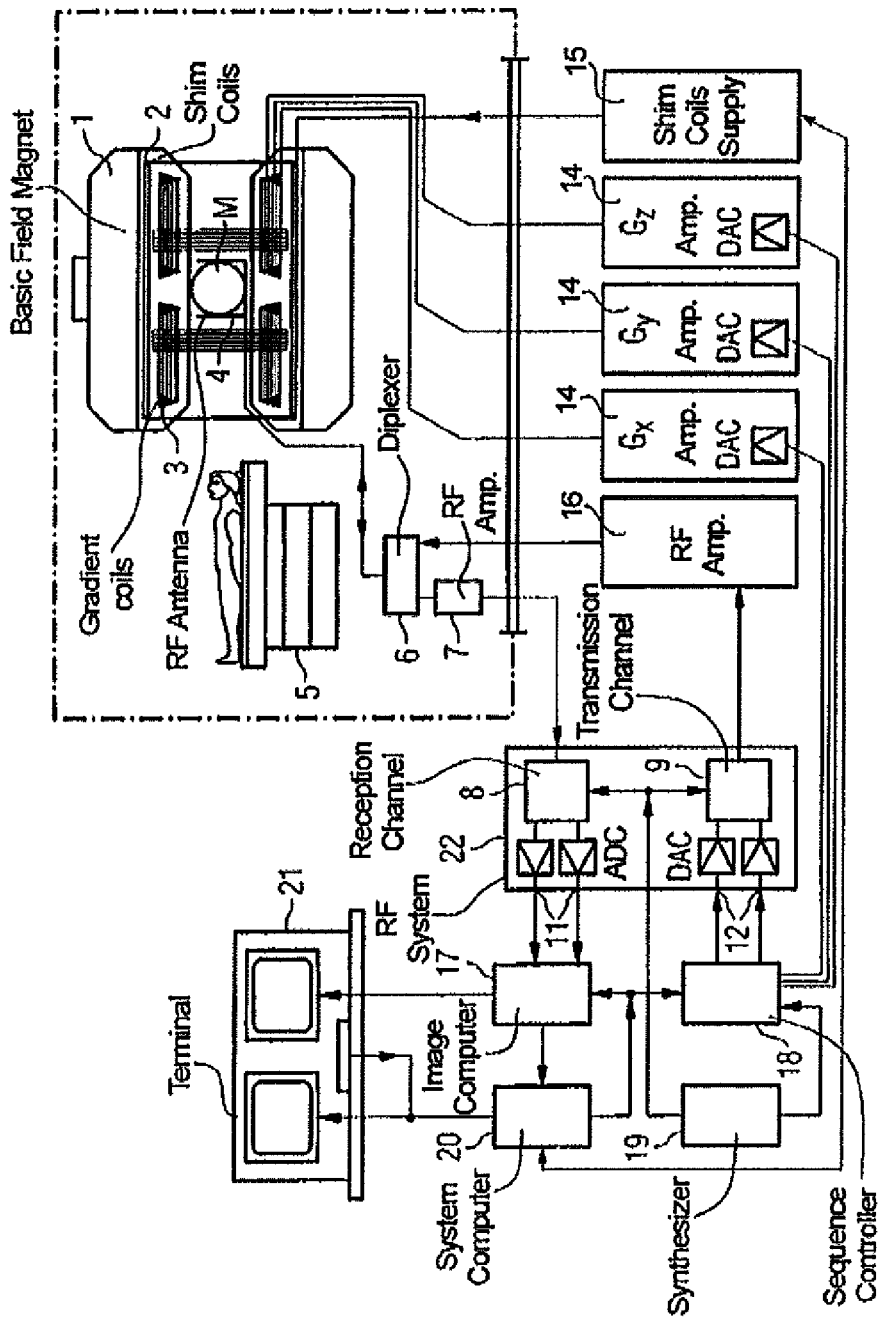
FIG. 1 shows a system for fat signal suppression in MR imaging, according to invention principles.

FIG. 1 shows system 10 for fat signal suppressed MR imaging. System 10 improves fat suppression in pulse sequences using a spin echo for signal generation. In one embodiment the system uses a spin-echo diffusion EPI sequence. Fat suppression is improved by using excitation and refocusing pulses with different slice select gradients e.g. by using a low bandwidth EPI excitation RF pulse and a high bandwidth refocusing pulse. Alternately, a high bandwidth excitation and low bandwidth refocusing pulse may be used. The slice-select gradient amplitudes of the two pulses are advantageously different.

A basic field magnet 1 generates a strong magnetic field, which is constant in time, for the polarization or alignment of the nuclear spins in the examination region of an object, such as, for example, a part of a human body to be examined. The high homogeneity of the basic magnetic field required for the magnetic resonance measurement is provided in a spherical measurement volume M, for example, into which the parts of the human body to be examined are brought. In order to satisfy the homogeneity requirements and especially for the elimination of time-invariant influences, shim-plates made of ferromagnetic material are mounted at suitable positions. Time-variable influences are eliminated by shim coils 2, which are controlled by a shim-current supply 15.

In the basic magnetic field 1, a cylinder-shaped gradient coil system 3 is used, which consists of three windings, for example. Each winding is supplied with current by an amplifier 14 in order to generate a linear gradient field in the respective directions of the Cartesian coordinate system. The first winding of the gradient field system 3 generates a gradient $G_x$ in the x-direction, the second winding generates a gradient $G_y$ in the y-direction, and the third winding generates a gradient $G_z$ in the z-direction. Each amplifier 14 contains a digital-analog converter, which is controlled by a sequence controller 18 for the generation of gradient pulses at proper times.

Within the gradient field system 3, radio-frequency (RF) coils 4 are located which convert the radio-frequency pulses emitted by a radio-frequency power amplifier 16 via multiplexer 6 into a magnetic alternating field in order to excite the nuclei and align the nuclear spins of the object to be examined or the region of the object to be examined. In one embodiment, RF coils 4 comprise a subset or substantially all of, multiple RF coils arranged in sections along the length of volume M corresponding to the length of a patient. Further, an individual section RF coil of coils 4 comprises multiple RF coils providing RF image data that is used in parallel to generate a single MR image. RF pulse signals are applied to RF coils 4, which in response produces magnetic field pulses which rotate the spins of the protons in the imaged body by ninety degrees or by one hundred and eighty degrees for so-called "spin echo" imaging, or by angles less than or equal to 90 degrees for so-called "gradient echo" imaging. In response to the applied RF pulse signals, RF coils 4 receive MR signals, i.e., signals from the excited protons within the body as they return to an equilibrium position established by the static and gradient magnetic fields. The MR signals comprising nuclear spin echo signals received by RF coils 4 as an alternating field resulting from the processing nuclear spins, are converted into a voltage that is supplied via an amplifier 7 and multiplexer 6 to a radio-frequency receiver processing unit 8 of a radio-frequency system 22.

The radio-frequency system 22 operates in an RF signal transmission mode to excite protons and in a receiving mode to process resulting RF echo signals. In transmission mode, system 22 transmits RF pulses via transmission channel 9 to initiate nuclear magnetic resonance in volume M. Specifically, system 22 processes respective RF echo pulses associated with a pulse sequence used by system computer 20 in conjunction with sequence controller 18 to provide a digitally represented numerical sequence of complex numbers. This numerical sequence is supplied as real and imaginary parts via digital-analog converter 12 in the high-frequency system 22 and from there to a transmission channel 9. In the transmission channel 9, the pulse sequences are modulated with a radio-frequency carrier signal, having a base frequency corresponding to the resonance frequency of the nuclear spins in the measurement volume M.

The conversion from transmitting to receiving operation is done via a multiplexer 6. RF coils 4 emit RF pulses to excite nuclear proton spins in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17. Imaging computer 17 reconstructs an image from the processed acquired RF echo pulse data. The processing of RF data, the image data and the control programs is performed under control of system computer 20. In response to predetermined pulse sequence control programs, sequence controller 18 controls generation of desired pulse sequences and corresponding scanning of k-space. In particular, sequence controller 18 controls the switching of the magnetic gradients at appropriate times, transmission of RF pulses with a determined phase and amplitude and reception of magnetic resonance signals in the form of RF echo data. Synthesizer 19 determines timing of operations of RF system 22 and sequence controller 18. The selection of appropriate control programs for generating an MR image and the display of the generated nuclear spin image is performed by a user via terminal (console) 21, which contains a keyboard and one or more screens. System 10 uses magnetic field gradients and radio frequency excitation to create an image. System computer 20 translates acquired k-space data onto a Cartesian grid and a Three-Dimensional Fourier Transform (3DFT) method is used to process the data to form a final image.

System computer 20 automatically (or in response to user command entered via terminal 21) employs and directs the MR imaging device of system 10 in acquiring images with suppressed fat signal. RF system 22 (an RF signal generator) generates RF pulses in a spin echo signal formation including, an RF excitation pulse and an RF refocusing pulse subsequent to the RF excitation pulse. Magnetic gradient field system 3 comprising a magnetic field slice select gradient generator generates first and second different slice select magnetic field gradients for corresponding use with the RF excitation pulse and the RF refocusing pulse, respectively. The first and second different slice select magnetic field gradients advantageously have substantially different amplitudes. MR imaging control unit of system computer 20 directs acquisition of MR imaging data having fat signal substantially suppressed using the generated RF pulses and different slice select magnetic field gradients.

If slice select magnetic field gradients having different slice select gradient strengths are applied, chemical shift causes different spatial shifts of the fat signal and the water signal in response to the excitation and refocusing pulses, thus preventing refocusing of the fat signal. If the slice-select gradient of one of the pulses is low enough (corresponding to the pulse being long enough), there is advantageously improved (and may be substantially perfect) fat suppression. The bandwidth that is needed as a function of the refocusing pulse bandwidth is:

$$Fatshift_{90} = Slicethickness + Fatshift_{180} \tag{1}$$

$$BW_{90} = \frac{\Delta f_{fat}}{\left(1 + \frac{\Delta f_{fat}}{BW_{180}}\right)} \tag{2}$$

Figure 3:
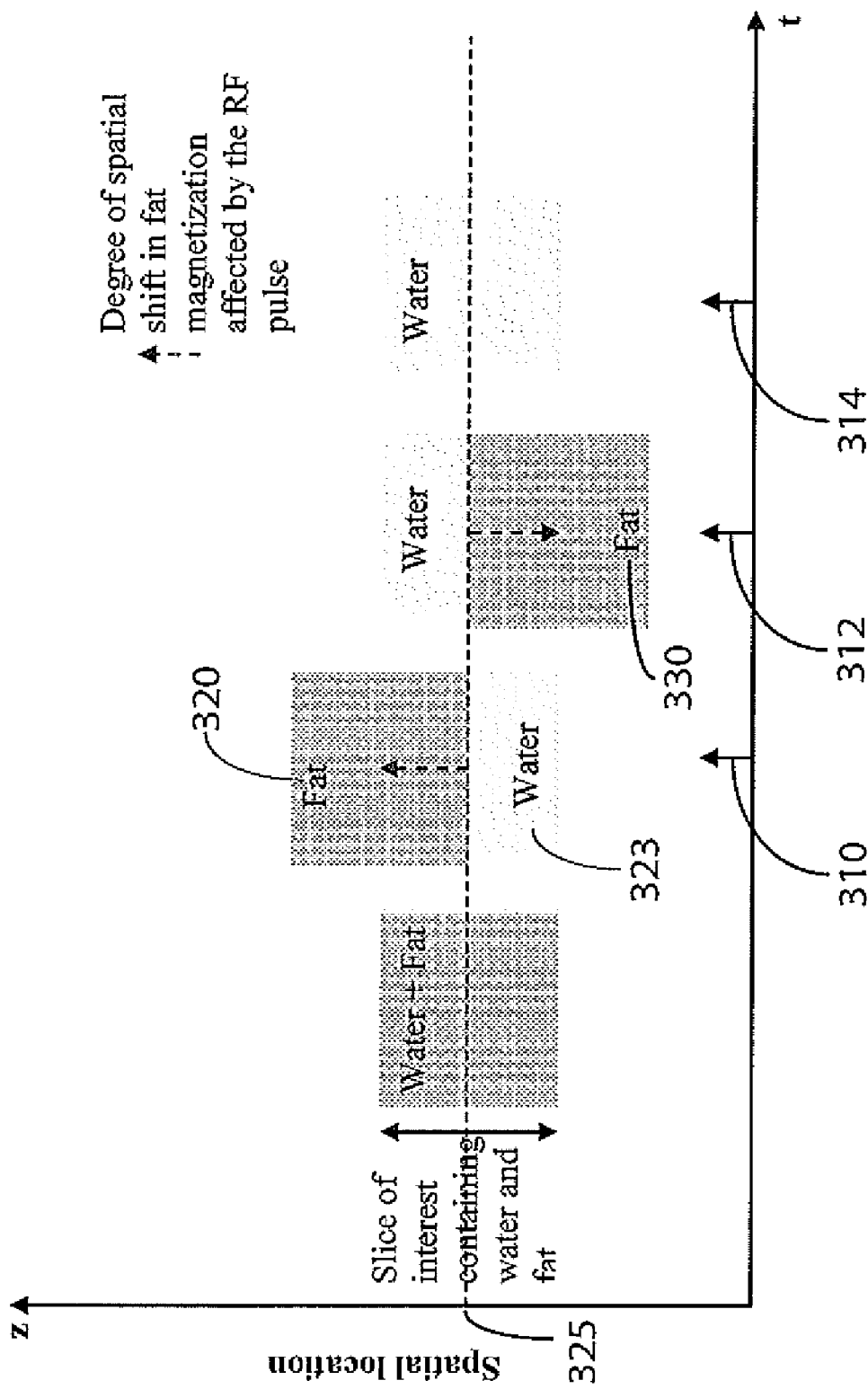
FIG. 3 shows a diagram indicating how fat signal suppression is achieved using different slice select gradients for excitation and refocusing pulses with a reversed slice select gradient for the refocusing pulse, according to invention principles.

System 10 advantageously employs a gradient reversal method in conjunction with different slice selection gradient amplitudes for the excitation RF pulse (termed low bandwidth excitation) for EPI, to reduced required lengthening of the RF pulse. This is achieved since spatial misregistration is now in opposite directions (as illustrated in FIG. 3 discussed later). In the case of slice-select gradient reversal, $$Fatshift_{90} = Slicethickness - Fatshift_{180} \tag{3}$$

$$BW_{90} = \frac{\Delta f_{fat}}{\left(1 - \frac{\Delta f_{fat}}{BW_{180}}\right)} \tag{4}$$

for $BW_{180} > \Delta f_{fat}$
(for $BW_{180} < \Delta f_{fat}$, $BW_{90}$ is irrelevant), $BW_{90}$ of equation 4 is greater than the bandwidth of the 90 degree pulse of Equation 1. Therefore, the required RF pulse duration with gradient reversal is advantageously reduced. The above analysis assumes the slice profiles of each pulse are substantially ideal. In practice, spatial shifts need to be higher due to imperfect slice profiles. A fat suppression pulse is used prior to EPI excitation in addition to excitation and refocusing pulses to account for slice profile imperfections of the excitation and refocusing pulses.

Figure 2:
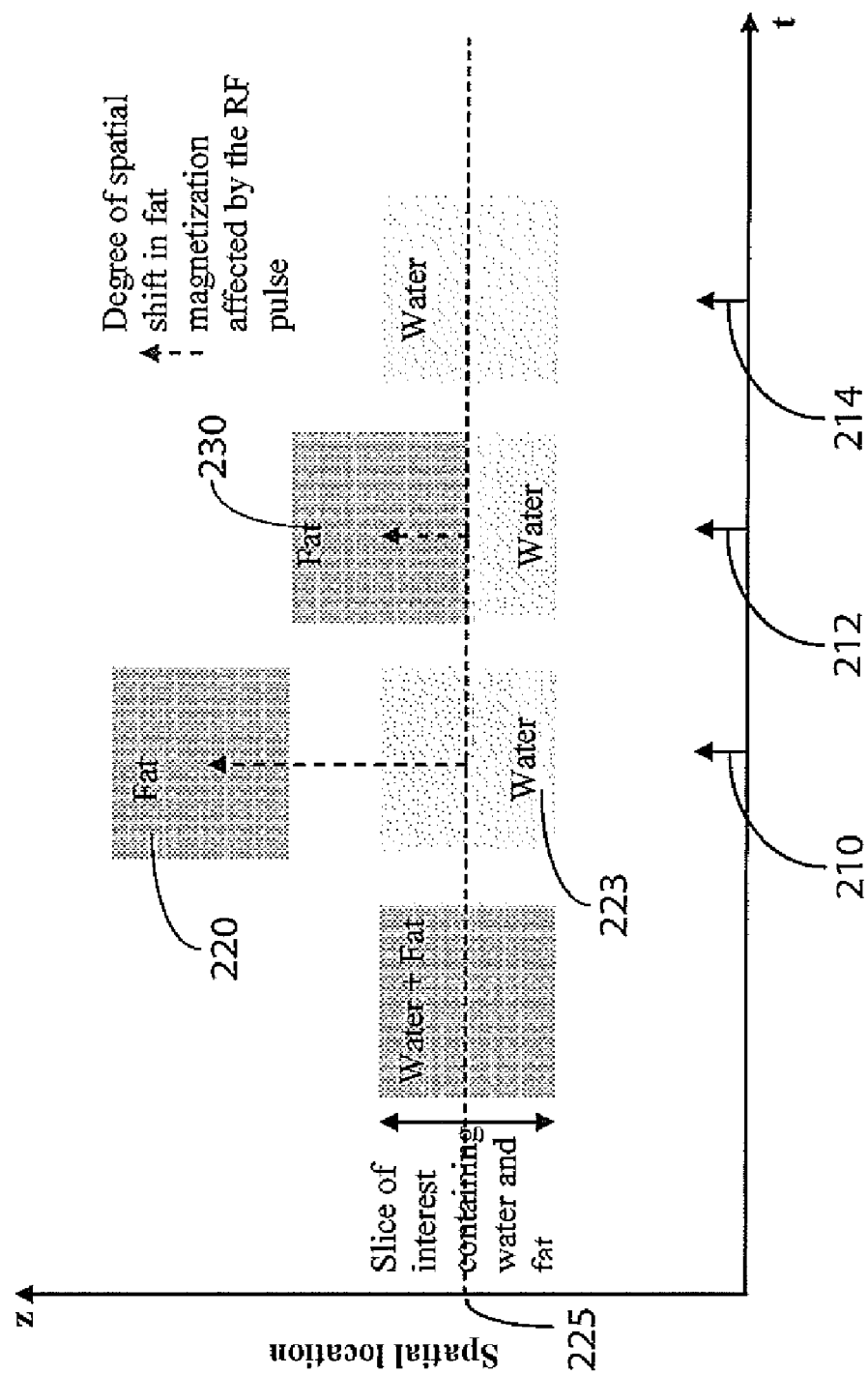
FIG. 2 shows a diagram indicating how fat signal suppression is achieved using different slice select gradients for excitation and refocusing pulses, according to invention principles.

FIG. 2 shows a diagram indicating how system 10 (FIG. 1) provides fat signal suppression using different slice select gradients for excitation and refocusing pulses. FIG. 2 shows spatial location plotted against time indicating spatial shift in fat and water magnetization in response to RF pulses for an MR imaged anatomical slice 225 containing both fat and water. System 10 applies a low bandwidth (low slice select gradient strength) 90 degree RF excitation pulse 210 generated by RF system 22 that causes fat 220 from a different spatial location than water 223 to be excited due to chemical shift. Similarly, RF refocusing pulse 212 generated by RF system 22 and having a different slice-select gradient strength (different RF bandwidth than excitation pulse 210) and without a slice-select gradient reversal, acts on fat 230 from yet a different spatial location. Specifically RF pulse 212 has a high slice-select gradient strength (higher RF bandwidth than excitation pulse 210) and no slice-select gradient reversal, that acts on fat 230 having less spatial shift in magnetization than fat 220 previously magnetized by excitation pulse 210. Further, second RF refocusing pulse 214 generated by RF system 22 has the high slice-select gradient strength (higher RF bandwidth than excitation pulse 210) without a slice-select gradient reversal and acts only on water so the fat does not see refocusing pulse 214 and the fat magnetization is consequently spoiled advantageously suppressing an MR fat signal.

FIG. 3 shows a diagram indicating how fat signal suppression is achieved using different slice select gradients for excitation and refocusing pulses with a reversed slice select gradient for the refocusing pulse. System 10 applies a low bandwidth (low slice select gradient strength) 90 degree RF excitation pulse 310 generated by RF system 22 that causes fat 320 from a different spatial location than water 323 in slice 325 to be excited due to chemical shift. Similarly, RF refocusing pulse 312 generated by RF system 22 and having a different slice-select gradient strength (different RF bandwidth than excitation pulse 310) and a slice-select gradient reversal, acts on fat 330 from yet a different spatial location. Specifically RF pulse 312 has a high slice-select gradient strength (higher RF bandwidth than excitation pulse 310) and a slice-select gradient reversal that acts on fat 330 having less spatial shift in magnetization than fat 320 magnetized by excitation pulse 310. Since reversing the slice-select gradient reverses the fat shift, the requirements on the shift of the fat during excitation are reduced, which consequently leads to a higher permissible slice-select gradient strength, i.e. a higher RF bandwidth, which corresponds to a shorter RF pulse. Further, second RF refocusing pulse 314 generated by RF system 22 has the high slice-select gradient strength (higher RF bandwidth than excitation pulse 310) without a slice-select gradient reversal and acts only on water so the fat does not see refocusing pulse 314 and the fat magnetization is consequently spoiled advantageously suppressing an MR fat signal.

Figure 4:
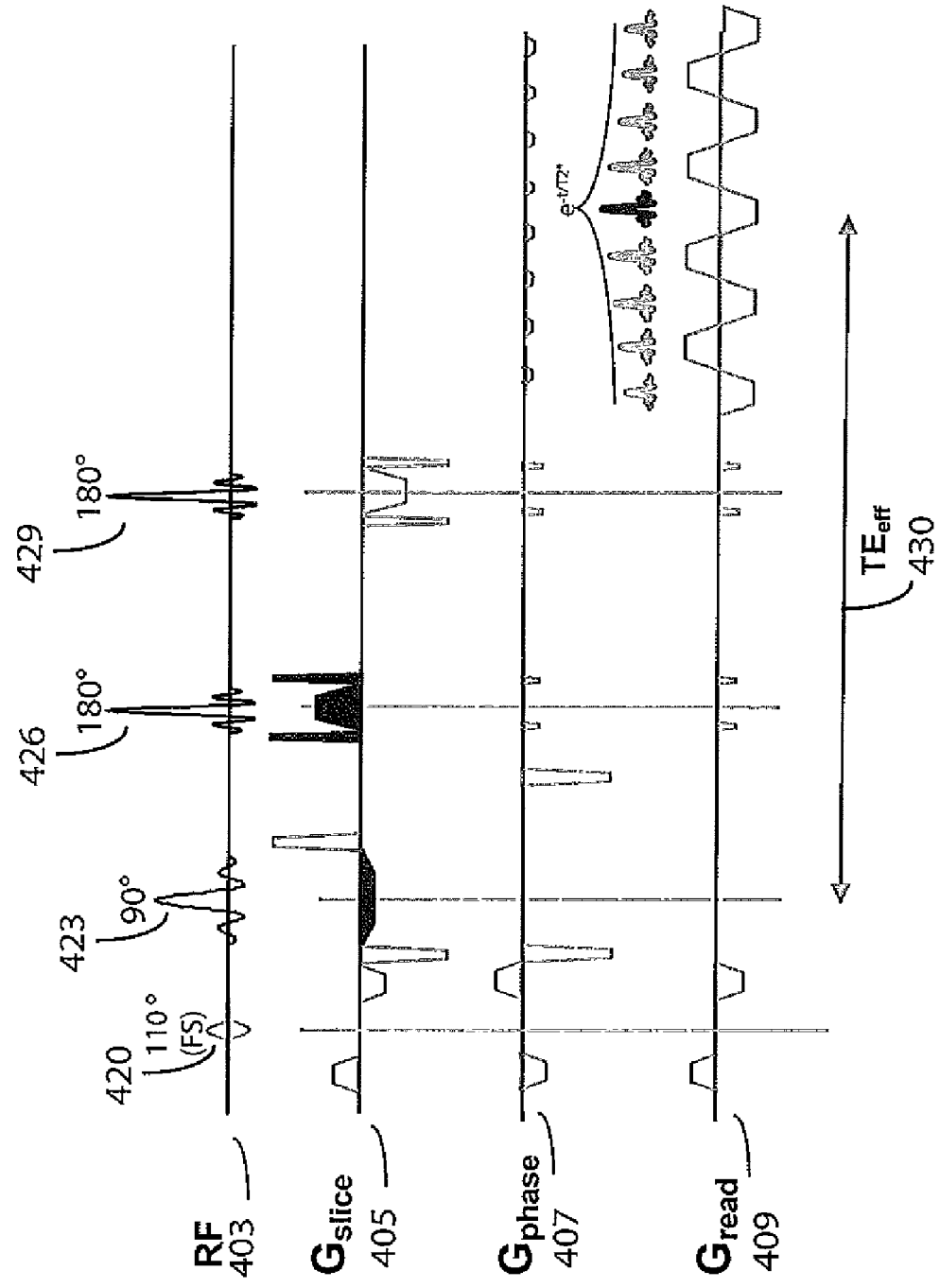
FIG. 4 shows a pulse sequence providing improved fat suppression, according to invention principles.

FIG. 4 shows a spin-echo EPI pulse sequence employed by system 10 (FIG. 1) for providing improved fat suppression comprising RF pulses 403, magnetic slice select gradient pulses 405, magnetic gradient pulse phase 407 and magnetic gradient read out pulses 409. A spectrally selective fat suppression (FS) RF pulse 420 is applied before EPI excitation RF pulse 423. Pulse 423 is a sine pulse having a bandwidth selectable by a user. System 10 applies a 180 degree refocusing pulse 426 comprising a high bandwidth refocusing pulse with a slice-select gradient of opposite polarity to excitation pulse 423. System 10 applies a second 180 degree refocusing pulse 429 comprising a high bandwidth refocusing pulse with a slice-select gradient of substantially the same polarity as excitation pulse 423 as indicated in slice select gradient pulses 405. System 10 acquires MR data in a single shot EPI readout with echo time (TE) 430.

Figure 5:
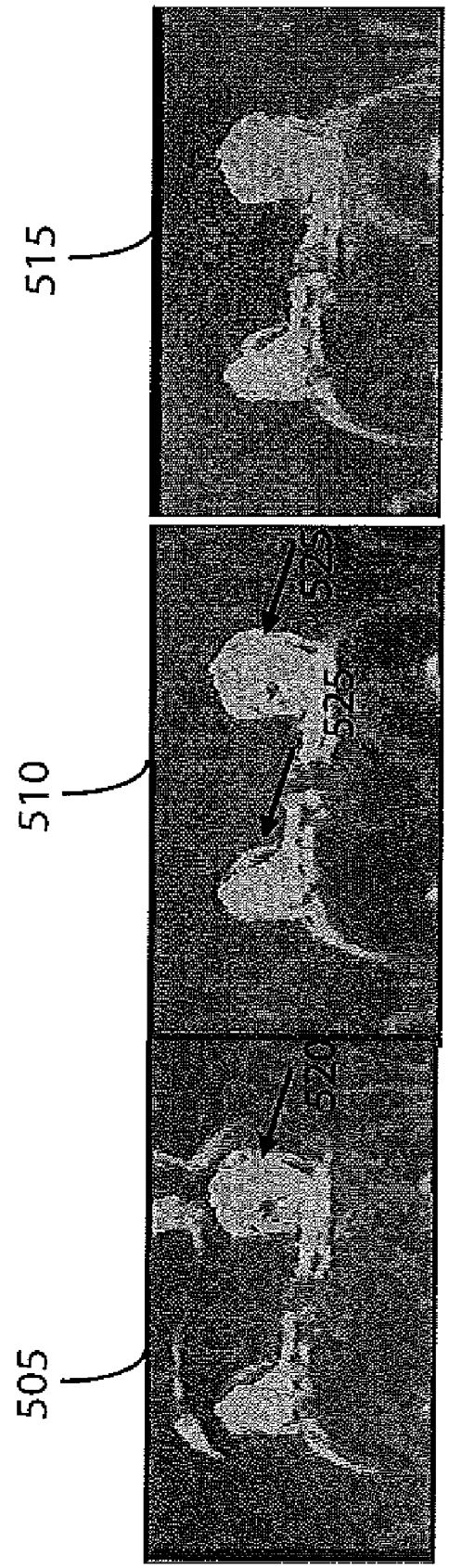
FIG. 5 show MRI mages acquired with (a) standard fat suppression scheme, (b) fat suppression with gradient reversal of a slice-select gradient of a refocusing pulse and (c) fat suppression, gradient reversal of slice-select gradient of the refocusing pulse, and use of a low bandwidth excitation pulse (i.e. low slice-select gradient of the excitation pulse), according to invention principles.

FIG. 5 shows three MRI mages acquired from two patients with (a) standard fat suppression scheme, (b) fat suppression with gradient reversal of a slice-select gradient of a refocusing pulse and (c) fat suppression, gradient reversal of slice-select gradient of the refocusing pulse, and use of a low bandwidth excitation pulse (i.e. low slice-select gradient of the excitation pulse). The images have been intentionally scaled up to emphasize fat elements. Specifically, image 505 is acquired using a known fat suppression method with one fat suppression pulse applied before an excitation pulse and shows remnant fat signal that causes image artifacts 520. Image 510 is acquired with a fat suppression pulse sequence with gradient reversal of slice-select gradient of a refocusing pulse to provide better fat suppression than image 505, but still exhibits unsuppressed fat signal artifacts 525. Image 515 is acquired with a fat suppression pulse sequence with gradient reversal of slice-select gradient of the refocusing pulse and use of a low bandwidth excitation pulse (i.e. low slice-select gradient of the excitation pulse) to substantially completely suppress fat signal effects.

Figure 6:
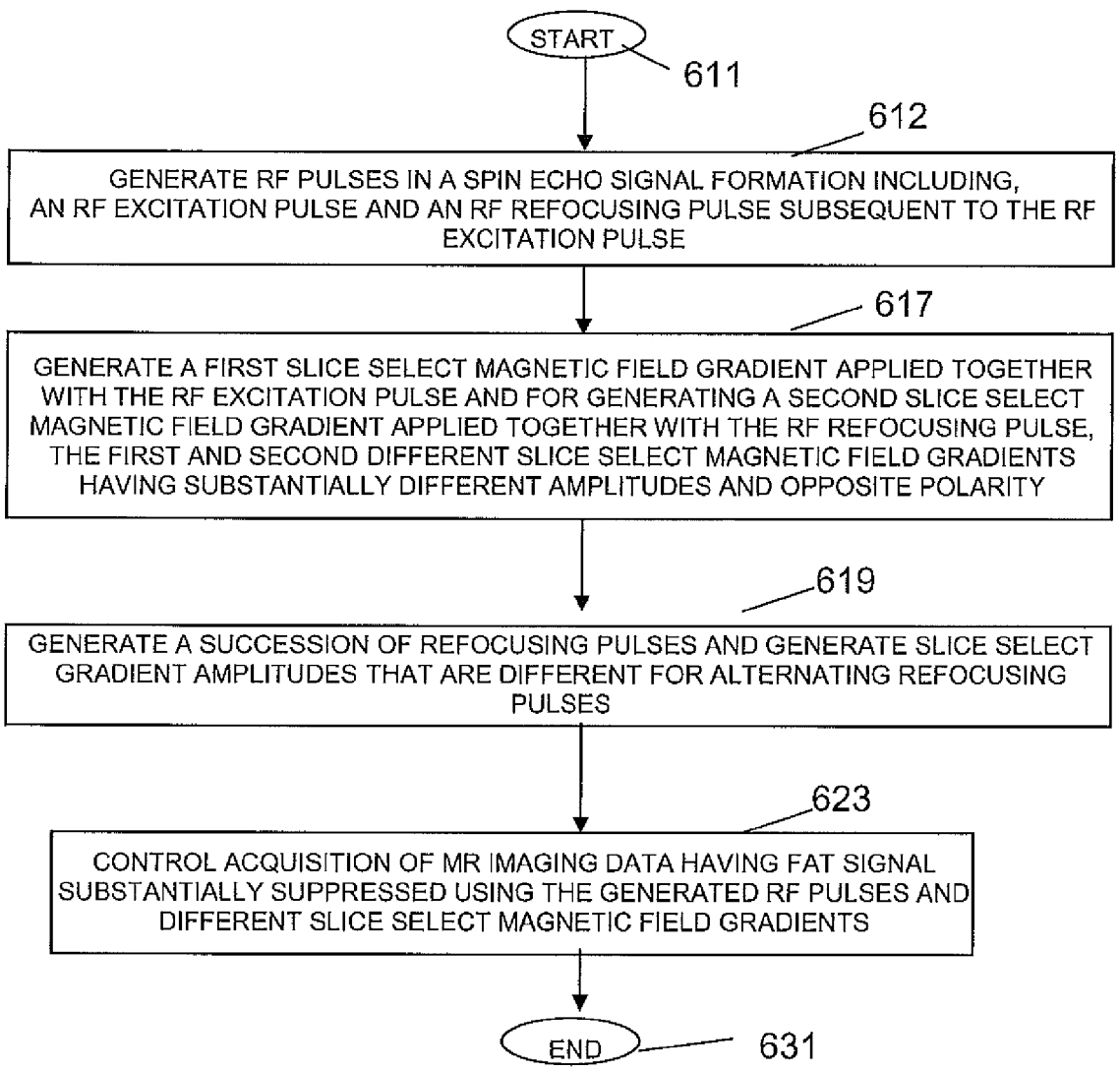
FIG. 6 shows a flowchart of a process performed by a system for fat signal suppression in MR imaging, according to invention principles.

FIG. 6 shows a flowchart of a process performed by system 10 (FIG. 1) for fat signal suppression in MR imaging. In step 612 following the start at step 611, RF signal generator 22 generates RF pulses in a spin echo signal formation including, an RF excitation pulse and an RF refocusing pulse subsequent to the RF excitation pulse. In step 617 magnetic gradient field system 3 comprising a magnetic field slice select gradient generator, generates a first slice select magnetic field gradient applied together with the RF excitation pulse and generates a second slice select magnetic field gradient applied together with the RF refocusing pulse. The first and second different slice select magnetic field gradients have substantially different amplitudes. In one embodiment the magnetic field slice select gradient generator generates first and second different slice select magnetic field gradients of opposite polarity. The first slice select magnetic field gradient has an amplitude selected so that spatial misregistration of fat is at least the sum of a slice thickness and spatial misregistration due to a second slice select gradient. The second slice select magnetic field gradient has an amplitude selected so that spatial misregistration of fat is at least the sum of a slice thickness and spatial misregistration due to a first slice select gradient.

In an embodiment, RF signal generator 22 in step 619 generates a succession of refocusing pulses and the magnetic field slice select gradient generator generates slice select gradient amplitudes that are different for alternating refocusing pulses. In step 623 system computer 20 (an MR imaging control unit) directs (controls) acquisition of MR imaging data having fat signal substantially suppressed using the generated RF pulses and different slice select magnetic field gradients. Further, RF signal generator 22 omits use of a spectrally selective fat suppression RF pulse prior to the RF excitation pulse however, in another embodiment, generator 22 generates a spectrally selective fat suppression RF pulse applied prior to the RF excitation pulse. The process of FIG. 6 terminates at step 631.

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a controller or microprocessor, for example, and is conditioned using executable instructions to perform special purpose functions not performed by a general purpose computer. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A user interface (UI), as used herein, comprises one or more display images, generated by a user interface processor and enabling user interaction with a processor or other device and associated data acquisition and processing functions.

The UI also includes an executable procedure or executable application. The executable procedure or executable application conditions the user interface processor to generate signals representing the UI display images. These signals are supplied to a display device which displays the image for viewing by the user. The executable procedure or executable application further receives signals from user input devices, such as a keyboard, mouse, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The system and processes of FIGS. 1-6 are not exclusive. Other systems and processes may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. The system uses different slice select gradients for the excitation and refocusing pulse in a spin-echo signal EPI sequence, for example to achieve fat suppression. Further, the processes and applications may, in alternative embodiments, be located on one or more (e.g., distributed) processing devices on a network linking the units of FIG. 1. Any of the functions, image controls and steps provided in FIGS. 1-6 may be implemented in whole or in part in hardware, software or a combination of both.

What is claimed is:

1. A system for fat signal suppression in MR imaging, comprising:
    an RF signal generator for generating RF pulses in an MR pulse sequence using one or more RF pulses for echo formation including,
        an RF excitation pulse and
        an RF refocusing pulse subsequent to said RF excitation pulse;
    a magnetic field slice select gradient generator for generating first and second different slice select magnetic field gradients for corresponding use with said RF excitation pulse and said RF refocusing pulse, respectively, said first and second different slice select magnetic field gradients having substantially different amplitudes; and
    an MR imaging control unit for directing acquisition of MR imaging data having fat signal substantially suppressed using the generated RF pulses and different slice select magnetic field gradients.

2. A system according to claim 1, wherein
    said RF signal generator, magnetic field slice select gradient generator and MR imaging control unit are in an MR imaging device.

3. A system according to claim 1, wherein
    said magnetic field slice select gradient generator generates first and second different slice select magnetic field gradients of opposite polarity and
    said RF signal generator generates a spectrally selective fat suppression RF pulse applied prior to said RF excitation pulse.

4. A system according to claim 1, wherein
    said magnetic field slice select gradient generator generates a first slice select magnetic field gradient having an amplitude selected so that spatial misregistration of fat is at least the sum of a slice thickness and spatial misregistration due to a second slice select gradient.

5. A system according to claim 4, wherein
    said magnetic field slice select gradient generator generates a second slice select magnetic field gradient having an amplitude selected so that spatial misregistration of fat is at least the sum of a slice thickness and spatial misregistration due to a first slice select gradient.

6. A system according to claim 1, wherein
    said RF signal generator generates a succession of refocusing pulses.

7. A system according to claim 6, wherein
    said magnetic field slice select gradient generator generates slice select gradient amplitudes that are different for alternating refocusing pulses.

8. A system according to claim 1, wherein
    said magnetic field slice select gradient generator generates a first slice select magnetic field gradient having an amplitude selected so that spatial misregistration of fat is at least the sum, of a slice thickness and spatial misregistration due to a second slice select gradient,
    said magnetic field slice select gradient generator generates a second slice select magnetic field gradient having an amplitude selected so that spatial misregistration of fat is at least the sum of a slice thickness and spatial misregistration due to a first slice select gradient and
    a succession of refocusing pulses are used instead of only two refocusing pulses and slice select gradient amplitude is different on alternating refocusing pulses.

9. A system according to claim 1, wherein
said RF signal generator generates a spectrally selective fat suppression RF pulse prior to said RF excitation pulse.

10. A system according to claim 1, wherein
said RF signal generator omits use of a spectrally selective fat suppression RF pulse prior to said RF excitation pulse.

11. A system for fat signal suppression in MR imaging, comprising:
- an RF signal generator for generating RF pulses in a spin echo signal formation including,
  - an RF excitation pulse and
  - an RF refocusing pulse subsequent to said RF excitation pulse;
- a magnetic field slice select gradient generator for generating a first slice select magnetic field gradient applied together with said RF excitation pulse and for generating a second slice select magnetic field gradient applied together with said RF refocusing pulse, the first and second different slice select magnetic field gradients having substantially different amplitudes and opposite polarity; and
- an MR imaging control unit for directing acquisition of MR imaging data having fat signal substantially suppressed using the generated RF pulses and different slice select magnetic field gradients.

12. A system according to claim 11, wherein
said magnetic field slice select gradient generator generates a first slice select magnetic field gradient having an amplitude selected so that spatial misregistration of fat is at least the sum of a slice thickness and spatial misregistration due to a second slice select gradient.

13. A system according to claim 12, wherein
said magnetic field slice select gradient generator generates a second slice select magnetic field gradient having an amplitude selected so that spatial misregistration of fat is at least the sum of a slice thickness and spatial misregistration due to a first slice select gradient.

14. A system according to claim 11, wherein
said RF signal generator generates a succession of refocusing pulses.

15. A system according to claim 14, wherein
said magnetic field slice select gradient generator generates slice select gradient amplitudes that are different for alternating refocusing pulses.

16. A system according to claim 11, wherein
said magnetic field slice select gradient generator generates a first slice select magnetic field gradient having an amplitude selected so that spatial misregistration of fat is at least the sum of a slice thickness and spatial misregistration due to a second slice select gradient,
said magnetic field slice select gradient generator generates a second slice select magnetic field gradient having an amplitude selected so that spatial misregistration of fat is at least the sum of a slice thickness and spatial misregistration due to a first slice select gradient and
a succession of refocusing pulses are used instead of only two refocusing pulses and slice select gradient amplitude is different on alternating refocusing pulses.

17. A system according to claim 11, wherein
said RF signal generator generates a spectrally selective fat suppression RF pulse applied prior to said RF excitation pulse.

18. A system according to claim 11, wherein
said RF signal generator omits use of a spectrally selective fat suppression RF pulse prior to said RF excitation pulse.

19. A method for fat signal suppression in MR imaging, comprising the activities of:
- generating RF pulses in a spin echo signal arrangement including,
  - an RF excitation pulse and
  - an RF refocusing pulse subsequent to said RF excitation pulse;
- generating first and second different slice select magnetic field gradients for corresponding use with said RF excitation pulse and said RF refocusing pulse, respectively, said first and second different slice select magnetic field gradients having substantially different amplitudes; and
- controlling acquisition of MR imaging data having fat signal substantially suppressed using the generated RF pulses and different slice select magnetic field gradients.

20. A method according to claim 19, including the activity of
generating the first and second different slice select magnetic field gradients having opposite polarity.

* * * * *